(12) United States Patent  
Ohkubo et al.

(10) Patent No.: US 7,391,092 B2  
(45) Date of Patent: Jun. 24, 2008

(54) INTEGRATED CIRCUIT INCLUDING A TEMPERATURE MONITOR ELEMENT AND THERMAL CONDUCTING LAYER

(75) Inventors: Hiroaki Ohkubo, Kanagawa (JP); Yasutaka Nakashiba, Kanagawa (JP); Naoyoshi Kawahara, Kanagawa (JP); Hiroshi Murase, Kanagawa (JP); Naoki Oda, Tokyo (JP); Tokuhito Sasaki, Tokyo (JP); Nobukazu Ito, Tokyo (JP)

(73) Assignees: NEC Electronics Corporation, Kawasaki, Kanagawa (JP); NEC Corporation, Tokyo (JP)

( * ) Notice: Subject to any disclaimer, the term of this patent is extended or adjusted under 35 U.S.C. 154(b) by 202 days.

(21) Appl. No.: 11/088,995

(22) Filed: Mar. 24, 2005

(65) Prior Publication Data

US 2005/0218471 A1 Oct. 6, 2005

(30) Foreign Application Priority Data

Mar. 30, 2004 (JP) ............................. 2004-101098

(51) Int. Cl.  
*H01L 31/058* (2006.01)

(52) U.S. Cl. ....................................... 257/467; 257/468

(58) Field of Classification Search ................. 257/108, 257/225, 252, 467–470, E23.08  
See application file for complete search history.

(56) References Cited

U.S. PATENT DOCUMENTS 6,307,194 B1 * 10/2001 Fitzgibbons et al. ...... 250/208.1

FOREIGN PATENT DOCUMENTS

| JP | 01-302849 | 12/1989 |
|----|-----------|---------|
| JP | 9-73049 | 3/1997 |
| JP | 9-179220 | 7/1997 |
| JP | 9-197344 | 7/1997 |
| JP | 09-229778 | 9/1997 |
| JP | 11-149126 | 6/1999 |
| JP | 11-330051 | 11/1999 |
| JP | 2002-207227 | 7/2002 |
| JP | 2002-365420 | 12/2002 |
| WO | WO 03/015424 A2 | 2/2003 |

OTHER PUBLICATIONS

Japanese Office Action dated Sep. 26, 2006, with partial English translation.

* cited by examiner

*Primary Examiner*—Hung Vu  
(74) *Attorney, Agent, or Firm*—McGinn IP Law Group PLLC

(57) ABSTRACT

In a semiconductor integrated circuit device, a sheet-like temperature monitor member of vanadium oxide is provided, whose one end is connected to one via while the other end is connected to another via. A sheet-like thermal conducting layer of aluminum is provided below the temperature monitor member. A region equal to or greater than a half of the entire temperature monitor member overlies the thermal conducting layer in a plan view.

18 Claims, 5 Drawing Sheets

INTEGRATED CIRCUIT INCLUDING A TEMPERATURE MONITOR ELEMENT AND THERMAL CONDUCTING LAYER

BACKGROUND OF THE INVENTION

1. Field of the Invention

The present invention relates to an integrated circuit device with a built-in monolithic temperature sensor.

2. Description of the Related Art

Recently, there are growing needs for monitoring the operation temperature of an integrated circuit device for the purpose of preventing thermal breakdown of devices in the integrated circuit device and stabilizing the operation of a device whose characteristic has temperature dependence.

In this respect, Japanese Patent Laid-Open Publication No. H1-302849, for example, discloses a technique of providing a temperature sensor on the same substrate as that of an LSI (Large Scale Integrated circuit). In the technique, the temperature sensor decides that the LSI is abnormally overheated when the temperature detected by the temperature sensor exceeds a predetermined value and then shutting down the LSI. Therefore, it can protect the LSI from thermally broken by a temperature rise. Japanese Patent Laid-Open Publication No. H9-229778 proposes the technique of using a parasitic pn junction diode as such a temperature sensor.

The technique that uses a parasitic pn diode as a temperature sensor has a problem such that as the temperature coefficient of the parasitic pn junction diode is as low as 0.2 (%/K), therefore a sufficient SNR (Signal-to-Noise Ratio) cannot be acquired.

The present inventors have developed a technique of forming a vanadium oxide film as a resistor having an electric resistivity whose temperature coefficient has a large absolute value, and has disclosed it in Japanese Patent Laid-Open Publication No. H11-330051.

The prior art technique suffers the following problems. When a resistor consisting of a vanadium oxide, for example, is formed and the temperature of an integrated circuit device is measured by measuring the resistance of the resistor, the ambient temperature of the resistor may not become uniform due to the influence of the internal and external environments of the integrated circuit device. For example, the flow of the current to wires or the like provided around the resistor locally raises the temperature, thus making the ambient temperature non-uniform. In this case, the internal temperature of the resistor becomes non-uniform, thus making the internal resistivity of the resistor non-uniform, so that the temperature cannot be measured accurately or stably.

SUMMARY OF THE INVENTION

It is an object of the present invention to provide an integrated circuit device which has a resistor, as a temperature sensor, whose electric resistance changes according to the temperature, and can measure the temperature accurately and stably.

An integrated circuit device according to the present invention comprises a temperature monitor element which is connected between two wires and whose electric resistance changes according to a temperature; and a thermal conducting layer containing a metal and/or an alloy provided at least either above or under the temperature monitor element and overlying a region equal to or greater than a half of the temperature monitor element as seen from a direction perpendicular to a top surface of the temperature monitor element.

According to the invention, the thermal conducting layer is provided at least either above or under the temperature monitor element. Even when the thermal conduction from outside the integrated circuit device is not uniform or heat is locally generated around the temperature monitor element, therefore, the heat is conducted through the thermal conducting layer, so that the ambient temperature of the temperature monitor element can be made uniform. This can ensure a uniform temperature inside the temperature monitor element and thus enables accurate and stable measurement of the temperature.

The thermal conducting layer may be provided under the temperature monitor element, or may be provided above the temperature monitor element. Alternatively, two thermal conducting layers there may be provided, and may be respectively provided above and below the temperature monitor element.

It is preferable that the thermal conducting layer should have: a first portion located at a region lying directly above, or a region lying directly under, the temperature monitor element; and a second portion coupled to the first portion and located at a region off the region lying directly above, or the region lying directly under, the temperature monitor element. In this case, at least a part of the second portion should preferably be provided sideways of the temperature monitor element. Accordingly, the thermal conducting layer also covers sideways of the temperature monitor element, further enhancing the uniform heat providing effect, i.e., the effect of making the ambient temperature of the temperature monitor element uniform. The thermal conducting layer may be provided on the entire surface of the integrated circuit device. This can permit heat accumulated in the thermal conducting layer to be promptly discharged out of the integrated circuit device, thereby improving the response to temperature measurement.

Further, it is preferable that the thermal conducting layer should be formed of one metal selected from a group of aluminum, copper and titanium, or an alloy of the metal, or an alloy essentially consisting of two or more metals in the group. This improves the thermal conduction of the thermal conducting layer, thereby further enhancing the uniform heat providing effect.

It is further preferable that the temperature monitor element should be formed of vanadium oxide. This makes it possible to acquire the temperature monitor element the temperature coefficient of whose electric resistivity has a large absolute value, so that the temperature can be measured accurately.

It is preferable that the thermal conducting layer should be connected to the temperature monitor element. This can permit heat accumulated in the thermal conducting layer to be promptly discharged via the thermal conducting layer, thereby improving the response to temperature measurement.

It is also preferable that the integrated circuit device should further comprise a substrate on which the temperature monitor element and the thermal conducting layer should be provided and to which the thermal conducting layer is connected. This can allow heat accumulated in the thermal conducting layer to promptly escape to the substrate, thereby improving the response to temperature measurement.

Furthermore, it is preferable that the integrated circuit device should further comprise: a substrate; a multi-layer wiring structure which is provided on the substrate and on which the temperature monitor element and the thermal conducting layer are provided; and a logic circuit section provided at a top surface of the substrate and wiring layers located below a topmost layer of the multi-layer wiring structure, the temperature monitor element being provided at the topmost layer of the multi-layer wiring structure. This can prevent the logic circuit section from being contaminated by the material for the temperature monitor element.

According to the present invention, as the thermal conducting layer is provided at least either above or under the temperature monitor element, the ambient temperature of the temperature monitor element can be made uniform, so that the temperature can be measured accurately and stably.

DETAILED DESCRIPTION OF THE PREFERRED EMBODIMENTS

Figure 1:
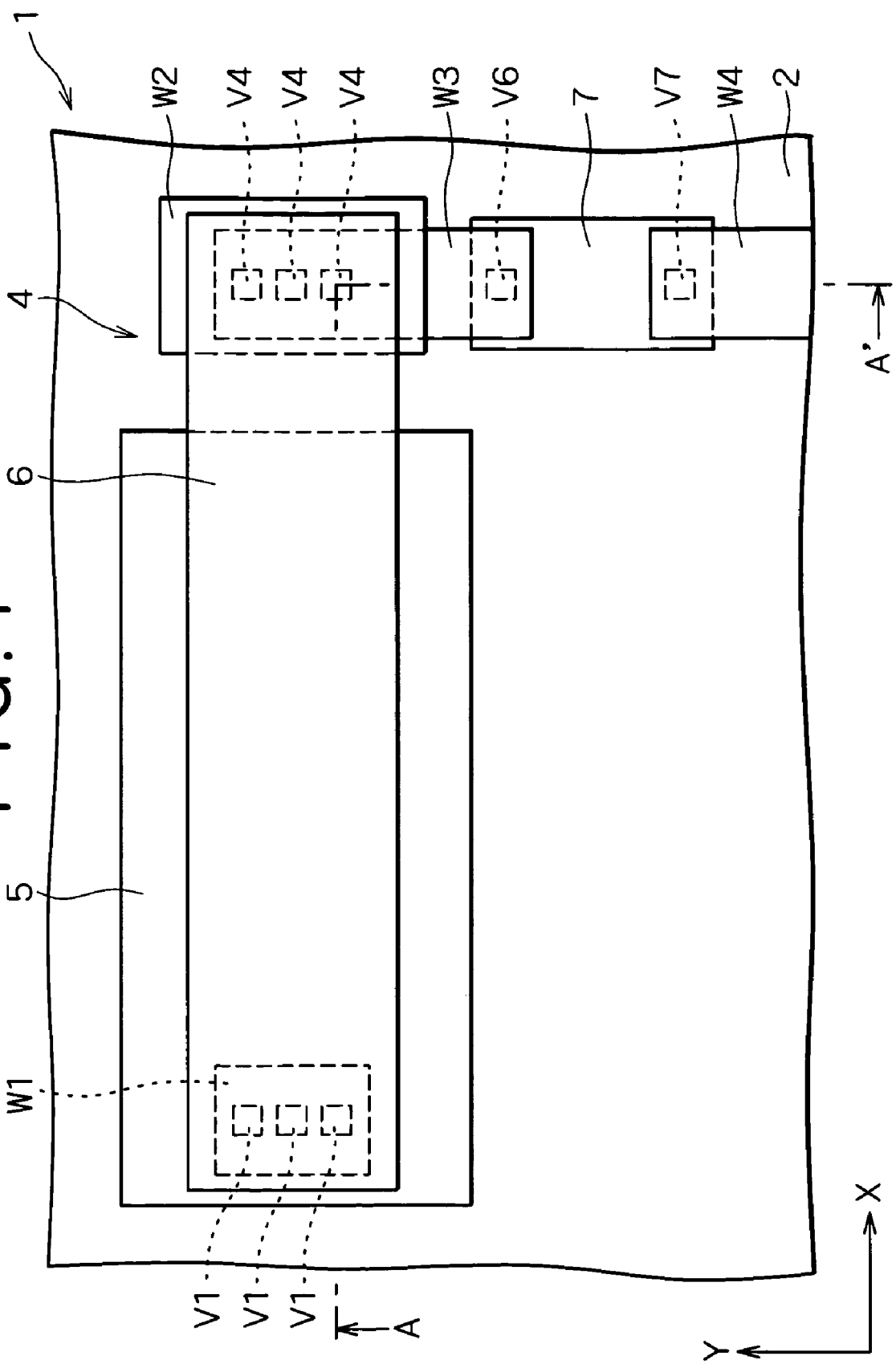
FIG. 1 is a plan view showing a semiconductor integrated circuit device according to a first embodiment of the invention.
Figure 2:
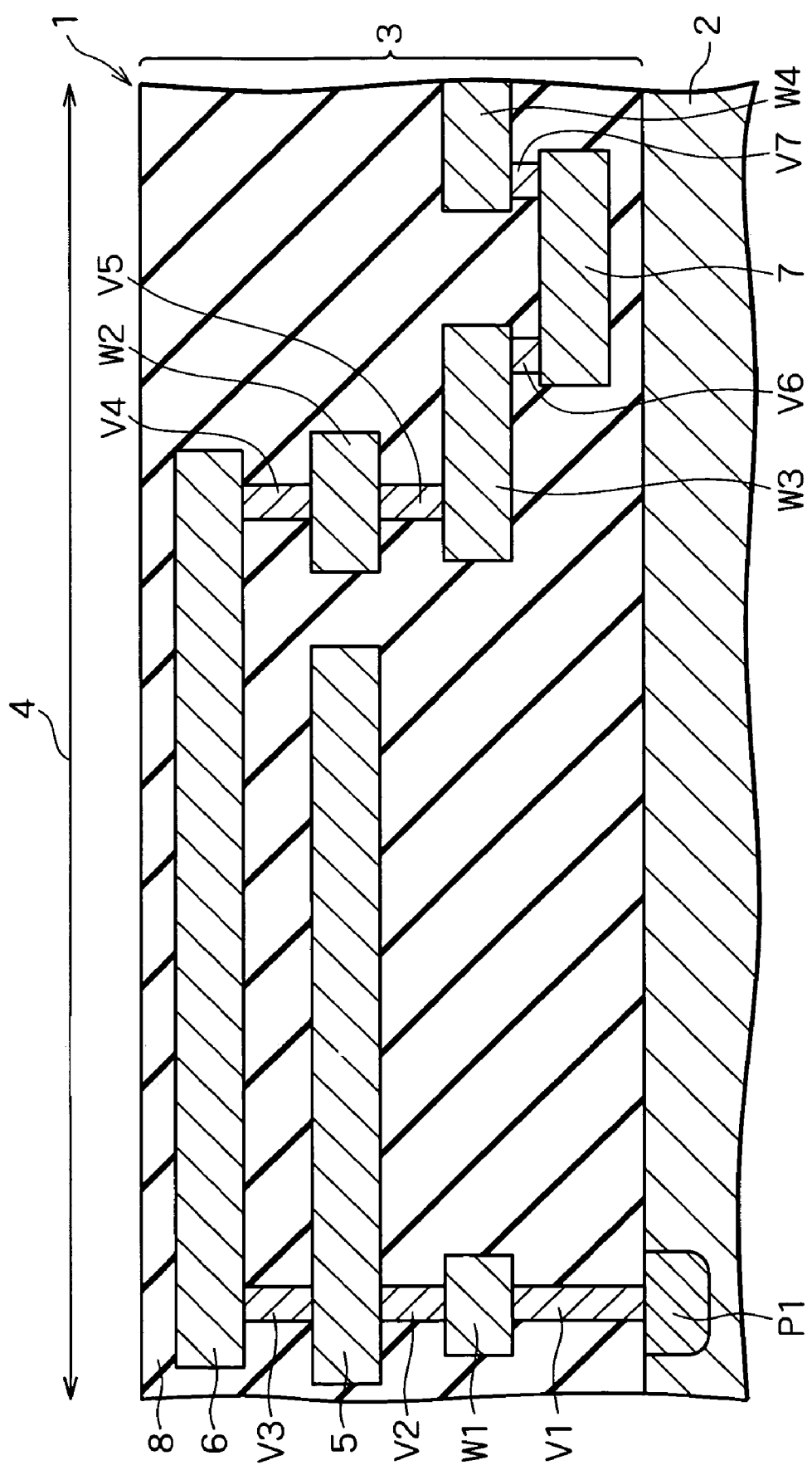
FIG. 2 is a cross-sectional view along line A-A' shown in FIG. 1.
Figure 3:
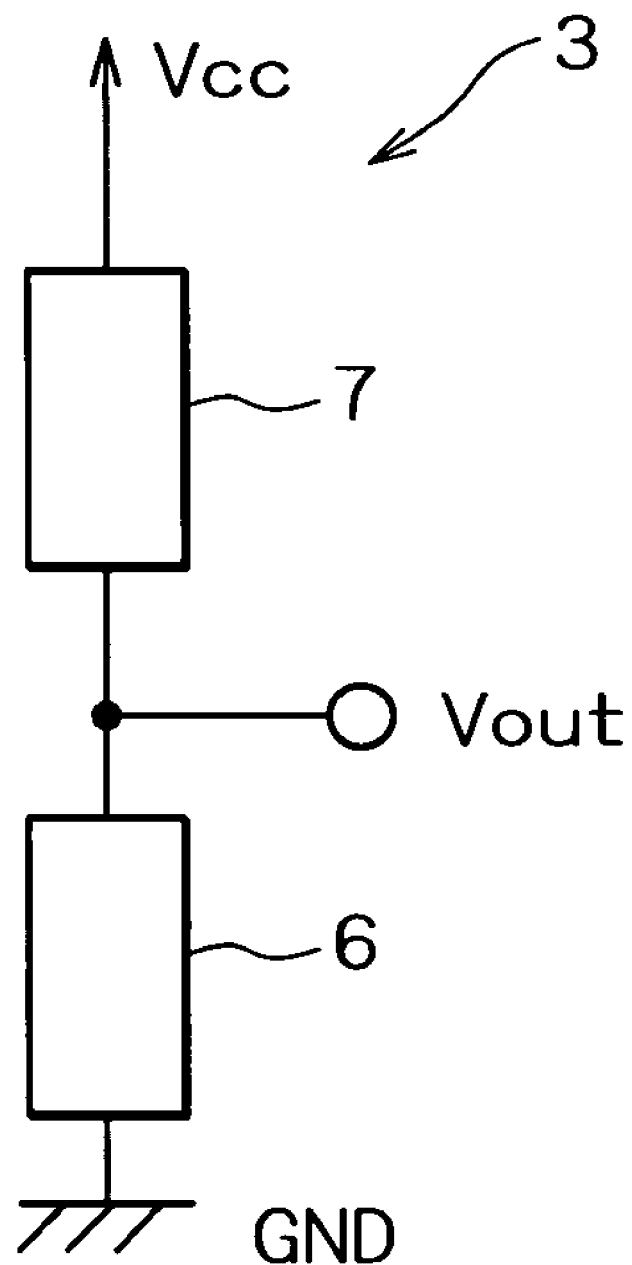
FIG. 3 is an equivalent circuit diagram showing a temperature sensor section of the semiconductor integrated circuit device shown in FIGS. 1 and 2.

Preferred embodiments of the invention will be described specifically below with reference to the accompanying drawings. To begin with, the first embodiment of the invention will be discussed. FIG. 1 is a plan view showing a semiconductor integrated circuit device according to the first embodiment of the invention, FIG. 2 is a cross-sectional view along line A-A' shown in FIG. 1, and FIG. 3 is an equivalent circuit diagram showing a temperature sensor section of the semiconductor integrated circuit device shown in FIGS. 1 and 2. The semiconductor integrated circuit device according to the embodiment is formed on a single silicon chip.

As shown in FIGS. 1 and 2, the semiconductor integrated circuit device 1 according to the embodiment is provided with a silicon substrate 2 of, for example, P type on which a multi-layer wiring structure 3 is provided. The multi-layer wiring layer 3 includes plural wiring layers and plural insulating layers alternately laminated. For example, first to third wiring layers are laminated with insulating layers therebetween. A temperature sensor section 4 is provided in the semiconductor integrated circuit device 1. A logic circuit section 10 (see FIG. 4) is provided at the top surface of the silicon substrate 2 and the wiring layers of the multi-layer wiring structure 3 excluding the topmost layer. The logic circuit section 10 performs processes, such as arithmetic and storing operations. The logic circuit section 10 may include a circuit which performs data processing on the measuring results from the temperature sensor section 4.

In the temperature sensor section 4, a $p^+$ diffusion region P1 is formed at a part of the top surface of the silicon substrate 2. A ground potential (GND) is supplied to the $p^+$ diffusion region P1 via the silicon substrate 2. Three vias V1 are provided in a line at that part of the multi-layer wiring structure 3 which lies above the $p^+$ diffusion region P1 in such a way as to be connected to the $p^+$ diffusion region P1. Referring to FIG. 1, the direction Y is the layout direction of the vias V1, and the direction X is a direction perpendicular to the direction Y and parallel to the top surface of the silicon substrate 2.

A first wire W1 is provided on the vias V1 in such a way as to be connected to the vias V1. The first wire W1 is formed at the first-level wiring layer or the first wiring layer as counted from the silicon substrate 2. Three vias V2 are provided on the first wire W1 in such a way as to be connected to the first wire W1. The vias V2 lie over the vias V1 as seen from a direction perpendicular to the top surface of the silicon substrate 2 (hereinafter referred to as "in a plan view"). A thermal conducting layer 5 is provided on the vias V2 in such a way as to be connected to the vias V2.

The thermal conducting layer 5 is provided at the second wiring layer, and is formed of, for example, aluminum. The thermal conducting layer 5 has a rectangular sheet-like shape in a plan view, and the lengthwise direction of the thermal conducting layer 5 is perpendicular to the layout direction of the vias V2, i.e., the direction X. The thermal conducting layer 5 has a length of, for example, 80 μm in the lengthwise direction (i.e., the direction X), a length of, for example, 60 μm in the short-side direction (the direction Y), and a thickness of, for example, 0.5 μm.

Three vias V3 are provided on the thermal conducting layer 5 in such a way as to be connected to one end of the thermal conducting layer 5. The vias V3 are provided directly above the vias V2 and V1, i.e., at positions where the vias V3 overlie the vias V2 and V1 in a plan view. Accordingly, the vias V2 and V3 are connected to one end of the thermal conducting layer 5 with nothing connected to the other end thereof.

A temperature monitor member 6 is provided on the vias V3 in such a way as to be connected to the vias V3. The temperature monitor member 6 is provided at the topmost layer or the third wiring layer of the multi-layer wiring structure 3. The temperature monitor member 6 has a rectangular sheet-like shape in a plan view, and the lengthwise direction of the temperature monitor member 6 is the same as the lengthwise direction of the thermal conducting layer 5, i.e., the direction X shown in FIG. 1. The temperature monitor member 6 has a length of, for example, 100 μm in the lengthwise direction (the direction X), a length of, for example, 50 μm in the short-side direction (the direction Y), and a thickness of, for example, 0.2 μm. The two sides of the temperature monitor member 6 extending in the short-side direction are respectively provided with electrodes (not shown) one of which is connected to the vias V3. In a plan view, the thermal conducting layer 5 extends out from both sides in the direction Y shown in FIG. 1 from a region lying directly below the temperature monitor member 6, and the temperature monitor member 6 extends out in the direction X from a region lying directly above the thermal conducting layer 5 so as to be far from the vias V1 to V3.

The temperature monitor member 6 is formed of, for example, vanadium oxide. Stable compounds of vanadium oxide are, for example, $VO_2$ and $V_2O_5$, and vanadium oxide is expressed by the chemical formula, $VO_x$, where x is around "2". The volume resistivity of the vanadium oxide when the temperature is 25° C. is, for example, 0.01 to 10 (Ω·cm) on the silicon wafer, and the temperature coefficient, which differs depending on the manufacture method, is about −2.0 (%/K). The resistance of the temperature monitor member 6 is, for example, several thousand to several ten thousand Ω, e.g., 25 kΩ.

Three vias V4 are provided at that portion of the multi-layer wiring structure 3 which lies under the temperature monitor member 6 in such a way as to be connected to the other electrode (not shown) of the temperature monitor member 6. The layout direction of the vias V4 is the direction Y. A second wire W2 is provided under the vias V4 in such a way as to be connected to the vias V4. The second wire W2, like the thermal conducting layer 5, is provided at the second wiring layer. An output terminal Vout (see FIG. 3) is connected to the second wire W2. Further, three vias V5 are provided below the second wire W2 in such a way as to be connected to the second wire W2. The vias V5 are provided at a region directly underlying the vias V4, and are provided in the direction Y. A first wire W3 is provided under the vias V5 in such a way as to be connected to the vias V5. In a plan view, the lengthwise direction of the first wire W3 is a direction perpendicular to the lengthwise direction of the temperature monitor member 6, i.e., the direction Y. The vias V5 are connected to one end of the first wire W3.

One via V6 is provided under the first wire W3 in such a way as to be connected to the other end of the first wire 10 W3. A temperature monitor member 7 is provided under the via V6 in such a way as to be connected to the via V6. The temperature monitor member 7 has a rectangular sheet-like shape in a plan view, and the lengthwise direction of the temperature monitor member 7 is the direction Y which is the same as the lengthwise direction of the first wire W3. The temperature monitor member 7 has a length of, for example, 100 µm in the lengthwise direction (the direction Y), a length of, for example, 2 µm in the short-side direction (the direction X), and a thickness of, for example, 0.2 µm. The two sides of the temperature monitor member 7 extending in the short-side direction are respectively provided with electrodes (not shown) one of which is connected to the via V6. The temperature monitor member 7 is formed of, for example, polysilicon. The resistance of the temperature monitor member 7 is set approximately the same as, for example, the resistance of the temperature monitor member 6, e.g., several thousand to several ten thousand Ω, e.g., 25 kΩ.

A via V7 is provided above the temperature monitor member 7 in such a way as to be connected to the other electrode (not shown) of the temperature monitor member 7. A first wire W4 is provided on the via V7 in such a way as to be connected to the via V7. Like the first wires W1 and W3, the first wire W4 is provided at the first wiring layer. A power-source potential (Vcc) is applied to the first wire W4.

With the structure, the vias V1, the first wire W1, the vias V2, the thermal conducting layer 5, the vias V3, the temperature monitor member 6, the vias V4, the second wire W2, the vias V5, the first wire W3, the via V6, the temperature monitor member 7, and the via V7 are connected in series in the named order from the p$^+$ diffusion region P1 where the ground potential (GND) is applied toward the first wire W4 where the power-source potential (Vcc) is applied.

As a result, as shown in FIG. 3, a circuit which consists of the temperature monitor member 7 and the temperature monitor member 6 connected in series in the named order is formed in the temperature sensor section 4 from the node to which the power-source potential Vcc is applied toward the node to which the ground potential GND is applied. The output terminal Vout is connected between the temperature monitor member 7 and the temperature monitor member 6.

The individual vias are formed of, for example, tungsten (W), and the individual wires are formed of, for example, aluminum (Al). The other portion of the multi-layer wiring structure 3 than the vias, the wires, the temperature monitor members and the thermal conducting layer is buried with an insulating material 8. In FIG. 1, the insulating material 8 is not shown.

In the semiconductor integrated circuit device 1 with the structure, the thermal conducting layer 5 is provided below the temperature monitor member 6, connected to the temperature monitor member 6 through the vias V3 and connected to the silicon substrate 2 through the vias V2, the first wire W1 and the vias V1. No wires and vias or the like, except the vias V3 connected between the thermal conducting layer 5 and the temperature monitor member 6, are provided between the thermal conducting layer 5 and the temperature monitor member 6. In a plan view, the thermal conducting layer 5 overlies approximately 80% of the area of the temperature monitor member 6.

The operation of the semiconductor integrated circuit device 1 according to the embodiment with the above-described structure will be discussed below. When the ground potential GND is applied to p$^+$ diffusion region P1 and the power-source potential Vcc is applied to the first wire W4, the potential of the output terminal Vout takes a value between the ground potential GND and the power-source potential Vcc, which is determined by the resistance of the temperature monitor member 6 and the resistance of the temperature monitor member 7. When the temperature of the semiconductor integrated circuit device 1 rises due to the outside temperature rises or the heat generated by the logic circuit section driven, the temperatures of the temperature monitor members 6 and 7 rise too, so that the resistance of the temperature monitor member 6 decreases. Because the material for the temperature monitor member 7 is polysilicon, the resistance of the temperature monitor member 7 hardly changes at this time. As the temperature rises, therefore, the potential at the output terminal Vout drops. Accordingly, the temperature of the semiconductor integrated circuit device 1 can be measured by detecting the potential of the output terminal Vout. The logic circuit section is controlled based on the measured temperature. When the measured temperature value exceeds a predetermined value, for example, it is decided that the logic circuit section is overheated, so that driving of the logic circuit section is stopped.

Even if heat is generated locally due to, for example, the flow of the current to the wires (not shown) provided under the temperature monitor member 6, the heat is transferred to the thermal conducting layer 5 before being transferred to the temperature monitor member 6, thereby heating the thermal conducting layer 5. As the heat flows from a relatively high temperature portion in the thermal conducting layer 5 to a relatively low temperature portion, the temperature distribution in the thermal conducting layer 5 is made uniform. Thereafter, the heat is transferred to the temperature monitor member 6 from the thermal conducting layer 5 via the insulating material 8. Accordingly, the heat is uniformly transferred to the temperature monitor member 6, making the temperature distribution inside the temperature monitor member 6 uniform. As a result, the electric resistivity in the temperature monitor member 6 becomes uniform. Even if local heat generation occurs below the temperature monitor member 6, therefore, the temperature can be measured accurately and stably. Because the electric resistance of the temperature monitor member 7 hardly changes even with a change in temperature, a thermal conducting layer need not be provided around the temperature monitor member 7.

During the temperature drop of the semiconductor integrated circuit device 1, the heat accumulated in the temperature monitor member 6 and the thermal conducting layer 5 are efficiently transferred to the silicon substrate 2 through the vias V3, the vias V2, the first wire W1 and the vias V1, so that the temperature monitor member 6 and the thermal conducting layer 5 can be cooled down quickly. This makes the response to temperature measurement higher.

As the thermal conducting layer 5 is provided under the temperature monitor member 6 in the embodiment, the influence of the local temperature distribution in the ambient environment of the temperature monitor member 6 can be eliminated, making the temperature distribution inside the temperature monitor member 6 uniform. This can improve the precision of the temperature measurement.

As the absolute value of the temperature coefficient of the electric resistivity of vanadium oxide which is the material for the temperature monitor member 6 about 2.0 (%/K), which is relatively large, a high SNR (Signal-to-Noise Ratio) can be acquired at the time of measuring the temperature. Because the vanadium oxide is chemically stable, the reliability of the temperature sensor section 4 can be improved. This results in an improvement of the reliability of the semiconductor integrated circuit device 1.

The logic circuit section can be controlled adequately based on the measured temperature from the temperature sensor section 4. For example, the logic circuit section can be prevented from being damaged by overheating.

Further, the temperature monitor member 6 is provided at the topmost layer of the multi-layer wiring structure 3 or the third wiring layer, and the logic circuit section is provided at a wiring layer lower than the topmost layer. This prevents the logic circuit section from being contaminated with vanadium oxide, so that the semiconductor manufacture equipment for manufacturing the logic circuit section will not be contaminated. Existing macros can be used for the logic circuit section. Because the temperature monitor member 6 can be formed after the formation of the logic circuit section, the logic circuit section can be formed by the conventional fabrication process. Therefore, the existing platform need not be changed for the logic circuit section. This can suppress an increase in manufacture cost which is originated from the provision of the temperature monitor member 6.

Figure 4:
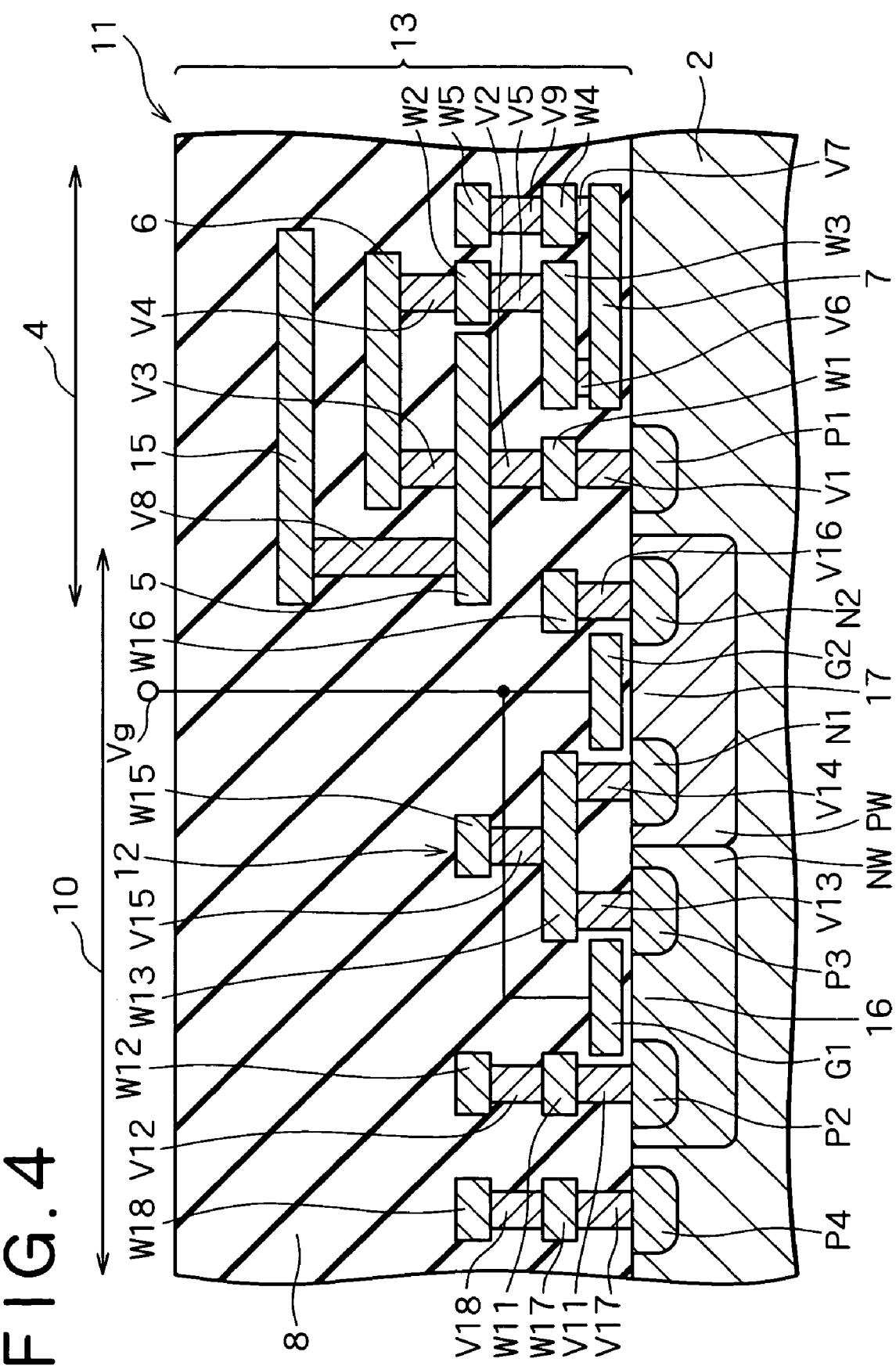
FIG. 4 is a cross-sectional view showing a semiconductor integrated circuit device according to a second embodiment of the invention.

The second embodiment of the invention will be described below. FIG. 4 is a cross-sectional view showing a semiconductor integrated circuit device according to the embodiment. As shown in FIG. 4, a semiconductor integrated circuit device 11 according to the embodiment differs from the semiconductor integrated circuit device 1 according to the first embodiment in the provision of a thermal conducting layer 15 provided above the temperature monitor member 6 in addition to the thermal conducting layer 5 provided below the temperature monitor member 6. The thermal conducting layer 15 has a rectangular sheet-like shape in a plan view. The thermal conducting layer 15 has a length of, for example, 110 μm in the lengthwise direction, a length of, for example, 60 μm in the short-side direction, and a thickness of, for example, 0.5 μm. The thermal conducting layer 15 is provided at that region in a multi-layer wiring structure 13 which lies directly above the temperature monitor member 6 and a region around the region, and overlies the entire area of the temperature monitor member 6 in a plan view. The thermal conducting layer 15 is formed of, for example, aluminum. The thermal conducting layer 15 is connected to the thermal conducting layer 5 by a via V8.

The direction from the end of the first wire W3 where the via V5 are connected toward the end where the via V6 is connected is the same as the direction from the end of the temperature monitor member 6 where the vias V4 are connected toward the end where the vias V3 are connected. Accordingly, the temperature monitor member 7 is provided at a part of a region directly underlying the temperature monitor member 6.

A via V9 is provided on the first wire W4 in such a way as to be connected to the first wire W4, and a second wire W5 is provided on the via V9 in such a way as to be connected to the via V9. The second wire W5 is the power-source potential wire to which the power-source potential Vcc is applied. Accordingly, the power-source potential Vcc is applied to the first wire W4 through the second wire W5 and the via V9. The other structure of the embodiment is the same as that of the first embodiment. Same reference symbols are given to those components of the semiconductor integrated circuit device 11 which are identical to the corresponding components of the semiconductor integrated circuit device 1 according to the first embodiment (see FIG. 1) to avoid repeating their redundant descriptions.

FIG. 4 shows the structure of a logic circuit section 10. As shown in FIG. 4, a CMOS (Complementary Metal Oxide Semiconductor) circuit 12, for example, is provided in the logic circuit section 10. In the CMOS circuit 12, an N well NW and a P well PW are formed at the top surface of the silicon substrate 2 in such a way as to be adjacent to each other. Two $p^+$ diffusion regions P2 and P3, which become source/drain regions, are formed, apart from each other, at the top surface of the N well NW. Two $n^+$ diffusion regions N1 and N2, which become the source/drain regions, are formed, apart from each other, at the top surface of the P well PW. There is a channel region 16 between the $p^+$ diffusion regions P2 and P3 in the N well NW. There is a channel region 17 between the $n^+$ diffusion regions N1 and N2 in the P well PW.

A gate insulating layer (not shown) is provided at that region in the multi-layer wiring layer 13 which includes regions directly overlying the channel regions 16 and 17, and gate electrodes G1 and G2 of, for example, polysilicon, are provided on the gate insulating layer respectively at the regions directly overlying the channel regions 16 and 17. The gate electrodes G1 and G2, which are formed at the same level as the temperature monitor member 7, are commonly connected to a gate terminal Vg. The channel region 16, the $p^+$ diffusion regions P2 and P3 as the source/drain regions, the gate insulating layer and the gate electrode G1 form a P type MOS transistor. The channel region 17, the $n^+$ diffusion regions N1 and N2 as the source/drain regions, the gate insulating layer and the gate electrode G2 form an N type MOS transistor.

A via V11 is provided on the $p^+$ diffusion region P2 in the multi-layer wiring layer 13 in such a way as to be connected to the $p^+$ diffusion region P2, and a first wire W11 is provided on the via V11 in such a way as to be connected to the via V11. A via V12 is provided on the first wire W11 in such a way as to be connected to the first wire W11, and a second wire W12 is provided on the via V12 in such a way as to be connected to the via V12. The second wire W12 is a power-source potential wire to which the power-source potential Vcc is applied. Accordingly, the $p^+$ diffusion region P2 is connected to the second wire W12 as the power-source potential wire through the via V11, the first wire W11 and the via V12.

A via V13 is provided on the $p^+$ diffusion region P3 in the multi-layer wiring layer 13 in such a way as to be connected to the $p^+$ diffusion region P3, and a via V14 is provided on the $n^+$ diffusion region N1 in such a way as to be connected to the $n^+$ diffusion region N1. A first wire W13 is provided on the vias V13 and V14 in such a way as to be connected to both vias V13 and V14. A via V15 is provided on the first wire W13 in such a way as to be connected to the first wire W13, and a second wire W15 is provided on the via V15 in such a way as to be connected to the via V15. Accordingly, the $p^+$ diffusion region P3 and the $n^+$ diffusion region N1 are connected to the second wire W15 through the vias V13 and V14, the first wire W13 and the via V15.

Further, a via V16 is provided on the $n^+$ diffusion region N2 in the multi-layer wiring layer 13 in such a way as to be connected to the $n^+$ diffusion region N2, and a first wire W16 is provided on the via V16 in such a way as to be connected to the via V16. The ground potential GND is applied to the first wire W16. Accordingly, the ground potential GND is applied to the n+ diffusion region N2 through the first wire W16 and the via V16.

A p+ diffusion region P4 is formed at that region of the top surface of the silicon substrate 2 which is other than the region where the N well NW and the P well PW are formed. A via V17, a first wire W17, a via V18 and a second wire W18 are provided on the p+ diffusion region P4 in the multi-layer wiring layer 13 in the named order in the bottom-to-top direction. The second wire W18 is a ground potential wire to which the ground potential GND is applied. Accordingly, the p+ diffusion region P4 is connected to the second wire W18 or the ground potential wire through the via V17, the first wire W17 and the via V18. While other elements than the CMOS circuit 12 are provided in the logic circuit section 10, they are not shown in FIG. 4.

Because the thermal conducting layer 5 is provided under the temperature monitor member 6 and the thermal conducting layer 15 is provided above the temperature monitor member 6 in the embodiment, it is possible to eliminate the influence of the local temperature distribution in the upper environment as well as the influence of the local temperature distribution in the lower environment. Even when the external temperature of the semiconductor integrated circuit device 11 is not uniform, for example, the heat that is transferred into the semiconductor integrated circuit device 11 from outside can be made uniform by the thermal conducting layer 15 before being transferred to the temperature monitor member 6. This can further improve the accuracy and stability of the temperature measurement. Further, the heat that is accumulated in the temperature monitor member 6 can be discharged out of the semiconductor integrated circuit device 11 via the thermal conducting layer 15. As the thermal conducting layer 15 is provided around the region directly overlying the temperature monitor member 6 in addition to that overlying region, the uniform heat providing effect and the heat discharge effect with respect to the temperature monitor member 6 are great.

As the temperature monitor member 7 is provided at a part of the region directly underlying the temperature monitor member 6, the area of the temperature sensor section 4 can be reduced.

Figure 5:
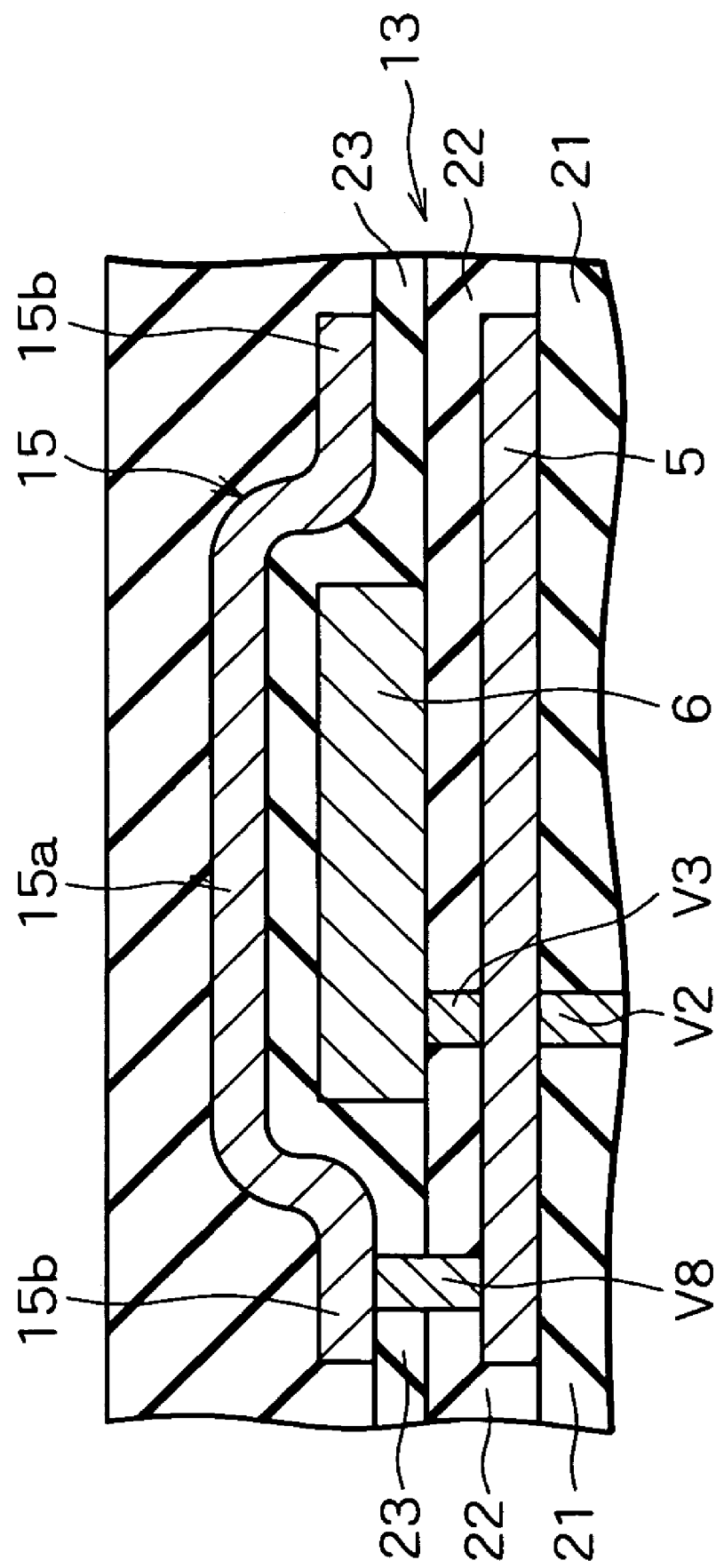
FIG. 5 is a cross-sectional view showing a temperature monitor member and a thermal conducting layer in a semiconductor integrated circuit device according to a modification of the second embodiment.

A modification of the second embodiment will be described next. FIG. 5 is a cross-sectional view showing a temperature monitor member and a thermal conducting layer in a semiconductor integrated circuit device according to the modification. As shown in FIG. 5, the vias V2 are formed inside an interlayer insulating layer 21 which is filled in the first wiring layer and the second insulating layer in the multi-layer wiring structure 13 of the semiconductor integrated circuit device 11 in the modification. The thermal conducting layer 5 is formed at the second wiring layer, and an interlayer insulating layer 22 is provided in such a way as to bury the thermal conducting layer 5, for forming the second wiring layer and the third insulating layer. The vias V3 are formed in the interlayer insulating layer 22.

The temperature monitor member 6 is provided on the interlayer insulating layer 22, and an interlayer insulating layer 23 is provided in such a way as to cover the temperature monitor member 6. The shape of the interlayer insulating layer 23 reflects the shape of the temperature monitor member 6, and the region directly overlying the temperature monitor member 6 and a portion around that overlying region rise above the other portions. The thermal conducting layer 15 is provided on the interlayer insulating layer 23. The thermal conducting layer 15 has a portion 15a positioned directly above the temperature monitor member 6 and a portion 15b positioned at a region excluding the region directly overlying the temperature monitor member 6. The shape of the thermal conducting layer 15 reflects the shape of the interlayer insulating layer 23. Therefore, the shape of the thermal conducting layer 15 reflects the shape of the temperature monitor member 6, and the region directly overlying the temperature monitor member 6 and a portion around that overlying region rise above the other portions. Accordingly, a part of the portion 15b is provided at a lower position than the position of the portion 15a, and on the side of the temperature monitor member 6. The via V8 which connects the thermal conducting layer 15 to the thermal conducting layer 5 is provided, penetrating the interlayer insulating layers 22 and 23. The interlayer insulating layers 21 to 23 are formed by the insulating material 8 (see FIG. 4). The other structure of the modification than has been discussed above is the same as that of the second embodiment.

Because the thermal conducting layer 5 is provided under the temperature monitor member 6, the portion 15a of the thermal conducting layer 5 is provided above the temperature monitor member 6, and the portion 15b of the thermal conducting layer 15 is provided on the side of the temperature monitor member 6 in the modification, it is possible to cover around the temperature monitor member with the thermal conducting layer more effectively as compared with the second embodiment. This makes the uniform heat providing effect more noticeable, so that the temperature can be measured more accurately. A plurality of vias V8 may be provided. This can make the vias V8 to be integrated with the thermal conducting layers 5 and 15, so that those components as a whole can function as a thermal conducting layer surrounding the temperature monitor member 6. This results in a further improvement on the uniform heat providing effect. The other operation and effects of the modification than have been discussed above are the same as those of the second embodiment.

Next, the third embodiment of the invention will be described. In the embodiment, unlike the second embodiment, the thermal conducting layer 5 (see FIG. 4) is not provided and only the thermal conducting layer 15 is provided. That is, the thermal conducting layer is provided only above the temperature monitor member, or above and on the side of the temperature monitor member 6. The other structure, operation and effects of the embodiment than have been discussed above are the same as those of the second embodiment.

In the second embodiment, the modification thereof, and the third embodiment, the thermal conducting layer 15 may be provided on the entire surface of the semiconductor integrated circuit device 11. This improves the heat discharging characteristics of the thermal conducting layers 5 and 15 and the temperature monitor member 6, making it possible to further improve the response to temperature measurement.

In the first and second embodiments illustrated, the area of the region where the thermal conducting layer 5 overlies the temperature monitor member 6 is approximately 80% of the temperature monitor member 6 in a plan view, and the area of the region where the thermal conducting layer 15 overlies the temperature monitor member 6 is the entire area (100%) of the temperature monitor member 6. The invention is not however limited to the example. Because the uniform heat providing effect and the heat discharging effect are enhanced as the ratio of the area of the temperature monitor member 6 which the thermal conducting layer overlies to the entire area of the temperature monitor member 6 gets higher, thus improving the precision of the temperature measurement. With the area ratio of 50% or above, however, certain effects can be noticed.

Although the foregoing description of the embodiments has been given of the example where the thermal conducting layer is formed of aluminum, the invention is not limited to this particular example, but the thermal conducting layer may be formed of a metal or an alloy. It should be noted however that from the viewpoint of the thermal conduction and easier handling in the semiconductor process, the thermal conducting layer should preferably be formed of one metal selected from a group of aluminum, copper and titanium, or an alloy of the metal, or an alloy essentially consisting of two or more metals in the group. The thermal conducting layer must contain a metal and/or an alloy.

Although the thermal conducting layer 5 and/or the thermal conducting layer 15 is connected to the temperature monitor member 6 and the silicon substrate 2 in the embodiments, the thermal conducting layer 5 and/or the thermal conducting layer 15 may be set electrically floating.

When the temperature monitor member 7 is formed of a material the temperature coefficient of whose electric resistivity has a large absolute value in the embodiments, it is preferable that the thermal conducting layer should be provided above and/or below the temperature monitor member 7.

Further, the temperature sensor section 4 may be formed at one location on the chip where the semiconductor integrated circuit device is formed, or may be formed at plural locations on the chip. For example, the temperature sensor sections 4 may be formed at a total of five locations, namely at the center portion and four corners of the chip. As the temperature sensor sections 4 are respectively provided at plural locations and the average value of the measurements of the individual temperature sensor sections 4 is computed, the accuracy of the temperature measurement can be made higher.

What is claimed is:

1. An integrated circuit device comprising:
    a temperature monitor element which is connected between two wires and whose electric resistance changes according to a temperature; and
    a thermal conducting layer containing a metal and/or an alloy provided at least one of above and under said temperature monitor element and overlying a region one of equal to and greater than a half of said temperature monitor element as seen from a direction perpendicular to a top surface of said temperature monitor element,
    wherein said thermal conducting layer provides a uniform temperature to said temperature monitor element.

2. The integrated circuit device according to claim 1, wherein wires not connected to said temperature monitor element and said thermal conducting layer are provided outside of a space defined between said temperature monitor element and said thermal conducting layer.

3. The integrated circuit device according to claim 1, wherein said thermal conducting layer is provided under said temperature monitor element.

4. The integrated circuit device according to claim 1, wherein said thermal conducting layer comprises:
    a first portion located at one of a region lying directly above, and a region lying directly under, said temperature monitor element; and
    a second portion coupled to said first portion and located at one of a region off said region lying directly above, and said region lying directly under, said temperature monitor element.

5. The integrated circuit device according to claim 4, wherein at least a part of said second portion is provided sideways of said temperature monitor element.

6. The integrated circuit device according to claim 1, wherein said thermal conducting layer comprises at least one metal selected from a group consisting of aluminum, copper and titanium, an alloy of said metal, and an alloy essentially consisting of at least two metals from said group.

7. The integrated circuit device according to claim 1, wherein said temperature monitor element comprises vanadium oxide.

8. The integrated circuit device according to claim 1, wherein said thermal conducting layer is connected to said temperature monitor element.

9. The Integrated circuit device according to claim 1, further comprising a substrate on which said temperature monitor element and said thermal conducting layer are provided and to which said thermal conducting layer is connected.

10. An integrated circuit device comprising:
    a temperature monitor element which is connected between two wires and whose electric resistance changes according to a temperature;
    a thermal conducting layer containing a metal and/or an alloy provided at least one of above and under said temperature monitor element and overlying a region one of equal to and greater than a half of said temperature monitor element as seen from a direction perpendicular to a top surface of said temperature monitor element;
    a substrate;
    a multi-layer wiring structure which is provided on said substrate and on which said temperature monitor element and said thermal conducting layer are provided; and
    a logic circuit section provided at a top surface of said substrate and wiring layers located below a topmost layer of said multi-layer wiring structure, said temperature monitor element being provided at said topmost layer of said multi-layer wiring structure.

11. An integrated circuit device comprising:
    a temperature monitor element which is connected between two wires and whose electric resistance changes according to a temperature;
    a thermal conducting layer containing a metal and/or an alloy provided at least one of above and under said temperature monitor element and overlying a region one of equal to and greater than a half of said temperature monitor element as seen from a direction perpendicular to a top surface of said temperature monitor element; and
    a insulating material,
    wherein said temperature monitor element, said two wires, and said thermal conductor layer are formed in said insulating material.

12. The integrated circuit device according to claim 11, wherein heat is conducted through said thermal conducting layer and said insulating material to provide a uniform temperature to said temperature monitor element.

13. The integrated circuit device according to claim 11, further comprising:
    a substrate to which said thermal conducting layer is connected,
    wherein heat accumulated in said thermal conducting layer can be discharged through said insulating material to said substrate.

14. An integrated circuit device comprising:
    a temperature monitor element which is connected between two wires and whose electric resistance changes according to a temperature; and a thermal conducting layer containing a metal and/or an ahoy provided at least one of above and under said temperature monitor element and overlying a region one of equal to and greater than a half of said temperature monitor element as seen from a direction perpendicular to a top surface of said temperature monitor element, wherein said thermal conducting layer is connected to said temperature monitoring element to permit heat accumulated in said thermal conducting layer to be discharged to said temperature monitoring element.

15. An integrated circuit device comprising:
a temperature monitor element which is connected between two wires and whose electric resistance changes according to a temperature;
a thermal conducting layer containing a metal and/or an alloy provided at least one of above and under said temperature monitor element and overlying a region one of equal to and greater than a half of said temperature monitor element as seen from a direction perpendicular to a top surface of said temperature monitor element; and
a substrate to which said thermal conducting layer is connected,
wherein heat accumulated in said thermal conducting layer can be discharged to said substrate.

16. An integrated circuit device comprising:
a temperature monitor element which is connected between two wires and whose electric resistance changes according to a temperature;
a thermal conducting layer containing a metal and/or an alloy provided at least one of above and under said temperature monitor element and overlying a region one of equal to and greater than a half of said temperature monitor element as seen from a direction perpendicular to a top surface of said temperature monitor element; and
a logic circuit provided at an upper surface portion of said substrate and connected to said temperature monitor element,
wherein said logic circuit provides at least one of data processing of a signal from said temperature monitor element, and storing of data processed from said temperature monitor element.

17. An integrated circuit device comprising:
a temperature monitor element which is connected between two wires and whose electric resistance changes according to a temperature;
a thermal conducting layer comprising a metal provided at least one of above and under said temperature monitor element and overlying a region one of equal to and greater than a half of said temperature monitor element as seen from a direction perpendicular to a top surface of said temperature monitor element; and
an insulating material, said temperature monitor element and said thermal conducting layer formed in said insulating material,
wherein heat is transferred to said temperature monitor from the thermal conducting layer via said insulating material disposed between said temperature monitor and said thermal conducting layer.

18. The integrated circuit device according to claim 17, further comprising:
a logic circuit connected to said temperature monitor element and formed in said insulating material,
wherein said logic circuit provides at least one of data processing of a signal from said temperature monitor element, and storing of data processed from said temperature monitor element.

* * * * *